United States Patent
An et al.

(10) Patent No.: US 7,134,222 B2
(45) Date of Patent: Nov. 14, 2006

(54) TRANSFER APPARATUS

(75) Inventors: Geun-Soo An, Cheonan (KR); Gi-Cheon Yoon, Sungnam (KR)

(73) Assignee: Samsung Electronics Co., Ltd. (KR)

( * ) Notice: Subject to any disclaimer, the term of this patent is extended or adjusted under 35 U.S.C. 154(b) by 29 days.

(21) Appl. No.: 10/863,099

(22) Filed: Jun. 7, 2004

(65) Prior Publication Data
US 2005/0050752 A1    Mar. 10, 2005

(30) Foreign Application Priority Data
Aug. 21, 2003    (KR) .................... 10-2003-0057851

(51) Int. Cl.
*F26B 7/00* (2006.01)

(52) U.S. Cl. .................... 34/576; 34/580; 34/582; 34/585; 294/64.1; 269/21

(58) Field of Classification Search .......... 34/582, 34/585, 639, 640, 576, 580, 581, 509, 510, 34/61, 62, 63, 443; 294/64.1, 64.2, 64.3; 269/21; 271/97, 98, 195, 196; 414/225.01, 414/226.01, 737, 752, 752.1, 751.1; 901/40
See application file for complete search history.

(56) References Cited

U.S. PATENT DOCUMENTS 2,905,768 A * 9/1959 Cronquist .................... 360/230
4,009,785 A * 3/1977 Trayes ........................ 414/676
5,207,553 A * 5/1993 Konagai ...................... 414/737
6,099,056 A * 8/2000 Siniaguine et al. ......... 294/64.3

* cited by examiner

*Primary Examiner*—Kenneth Rinehart
(74) *Attorney, Agent, or Firm*—MacPherson Kwok Chen & Heid LLP

(57) ABSTRACT

A transfer apparatus is provided for the transport of transfer objects such as glass substrates or semiconductor devices in which cleanliness and secure transport are of major concern. A plurality of air nozzles inject air through the plurality of air nozzles to hold a transfer object in place above or below the plurality of air nozzles without the plurality of air nozzles making contact with the transfer object. The plurality of air nozzles are positioned perpendicular to the transfer object to stop and/or engage the transfer object in a rest position. The plurality of air nozzles are inclined to a specified angle to move the transferred object in a desired direction. Advantageously, because the transfer object is moved without physical contact between the structure of the air nozzles and the transfer object, the transfer is secure, clean, and efficient.

27 Claims, 14 Drawing Sheets

TRANSFER APPARATUS

BACKGROUND (a) Field of the Invention

The present invention relates to a transfer apparatus, and particularly to a transfer apparatus for transferring a large size glass substrate.

(b) Description of Related Art

In general, a transfer system or apparatus utilizes a conveyor apparatus to move a transfer object by placing the transfer object onto a conveyor which works in conjunction with an operating roller connected to an operating motor.

The conventional conveyor system uses the operating motor to provide power to move the transfer object and a chain, a gear, or a belt for the purpose of power transfer. Disadvantageously, the belt or chain may break or wear out causing maintenance problems and manufacturing delay.

Furthermore, since dust is generated due to the driving of a motor, the motor is arranged apart from the remainder of the conveyor system so as not to affect the transfer objects, such as semiconductor devices or liquid crystal displays ("LCDs"), in which cleanliness is an important issue. Therefore, because the motor is isolated from the place where the object is transferred, the operation is made more difficult, the system is more complicated, and the cost is increased.

Dust problems also arise with the use of gears. For a conventional apparatus, since one motor should drive a plurality of driving axes, a medium for transferring power, such as a gear, is required between each driving axes, which causes the dust problems indicated above.

If a motor and a conveyor belt are used, a noise problem also arises. The noise from machinery disturbs the operator or administrator, which decreases operation efficiency.

A transfer system or apparatus can be utilized to transfer glass substrates used in manufacturing liquid crystal displays ("LCDs"). An LCD is one of the most popular flat panel displays, which includes two panels provided with two kinds of electrodes generating an electric field and a liquid crystal layer interposed therebetween. The LCD displays images by controlling light transmittance, and the control of the light transmittance is performed by applying voltages to the electrodes to generate electric fields which change the arrangement of liquid crystal molecules.

The panels of an LCD can be transferred to processing devices used in the manufacturing process by using the transfer system. Conventionally, a plurality of glass substrates are transferred to a processing device using a cassette, a stocker, and an indexer. However, as glass substrates are getting larger, the conventional transfer system using the cassette, stocker, and indexer becomes harder to use and manage due to inflexibility and unwieldiness.

Various conventional transfer apparatuses such as conveyors, robots, stockers, AGVs (automatic guided vehicles), etc. have been enlarged in order to accommodate enlarged glass substrates. However, disadvantages remain with conventional systems and apparatus, such as generation of static electricity, decreased yield accompanied by contamination, and generation of cracks due to the contact between the glass substrate and the conveyor belt. Thus, there is a need in the art for a transfer apparatus that is flexible and clean and that transports objects securely without damage.

SUMMARY

The present invention provides an advantageous apparatus for transferring fragile objects, such as glass substrates used in the manufacture of LCDs, in which cleanliness and secure transport are of high concern. A plurality of air nozzles are used to transport glass substrates without making direct contact between the air nozzle structure and the substrate, thereby allowing for clean and secure transport of the substrate.

According to one embodiment of the present invention, a transfer apparatus is provided, including a panel, and a plurality of air nozzles operably coupled to the panel. The plurality of air nozzles can inject air to hold a transfer object in place above the plurality of air nozzles without the plurality of air nozzles making contact with the transfer object.

According to another embodiment of the present invention, another transfer apparatus is provided, including a connection body operably coupled to a guide line. A panel section is operably coupled to the connection body, and a plurality of air nozzles is operably coupled to the panel section. The plurality of air nozzles can inject air to hold a transfer object in place without the plurality of air nozzles making contact with the transfer object.

According to yet another embodiment of the present invention, another transfer apparatus is provided, including a panel, and a plurality of air nozzles operably coupled to the panel, wherein the plurality of air nozzles inject air while simultaneously providing suction to hold a transfer object in place without the plurality of air nozzles making contact with the transfer object.

Advantageously, the present invention allows for the secure and clean transport of glass substrates and other fragile objects, resulting in higher yields with less damage and contamination. The present invention also is advantageous to reduce noise while increasing transfer speed.

These and other features and advantages of the present invention will be more readily apparent from the detailed description of the embodiments set forth below taken in conjunction with the accompanying drawings.

BRIEF DESCRIPTION OF THE DRAWINGS

Use of the same reference symbols in different figures indicates similar or identical items. It is further noted that the drawings may not be drawn to scale.

DETAILED DESCRIPTION

The present invention now will be described more fully hereinafter with reference to the accompanying drawings, in which preferred embodiments of the invention are shown. The present invention may, however, be embodied in many different forms and should not be construed as limited to the embodiments set forth herein.

In the figures, the thickness of layers and regions are exaggerated for clarity. Like numerals refer to like elements throughout. It will be understood that when an element such as a layer, region, or substrate is referred to as being "on" another element, the element can be directly on the other element or intervening elements may also be present. In contrast, when an element is referred to as being "directly on" another element, there are no intervening elements present.

A transfer apparatus according to preferred embodiments of the present invention will now be described in detail with reference to the accompanying drawings.

Figure 1:
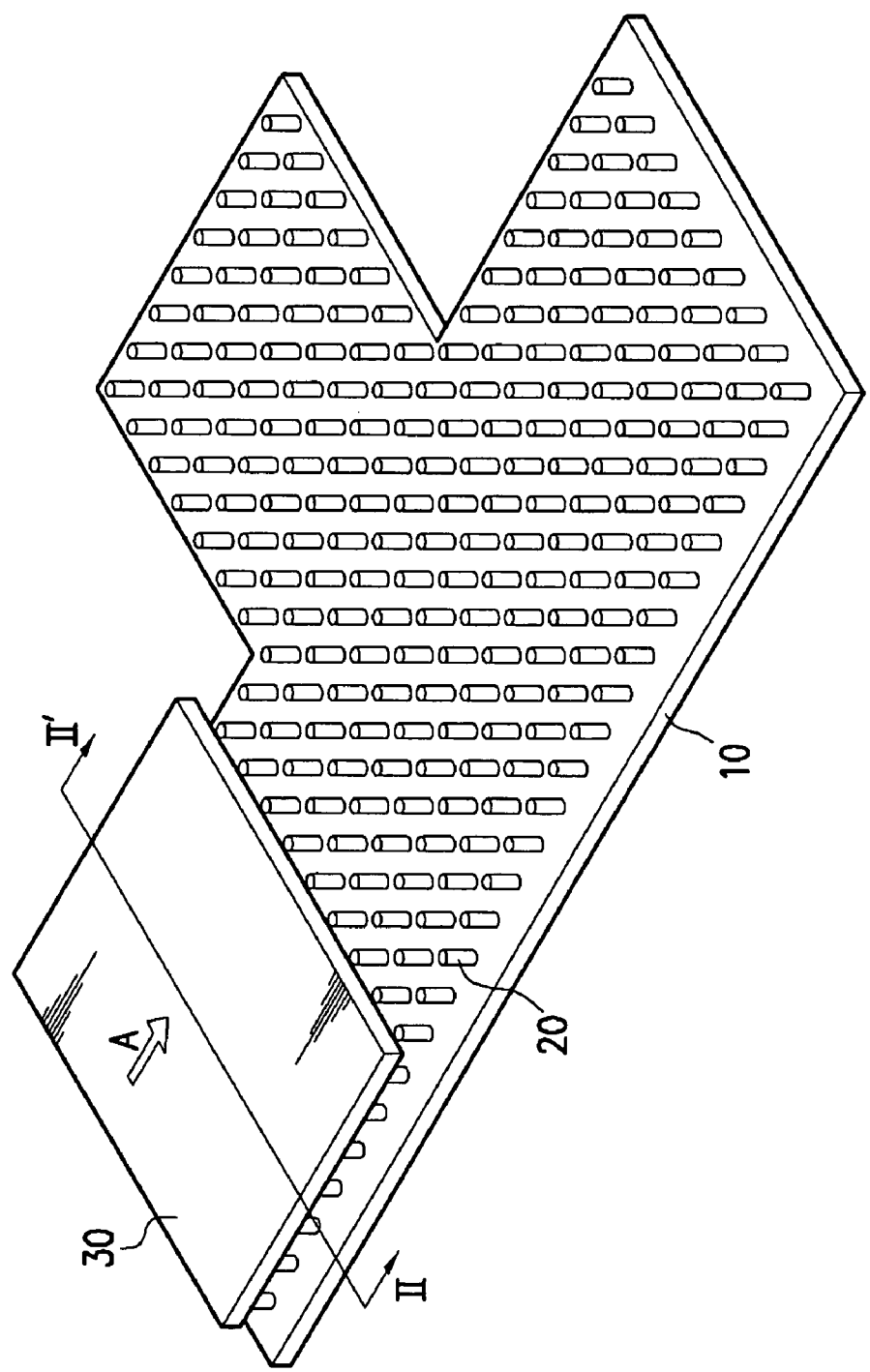
FIG. 1 is a perspective view of a transfer apparatus according to a first embodiment of the present invention showing a state in which a glass substrate is stopped.
Figure 2:
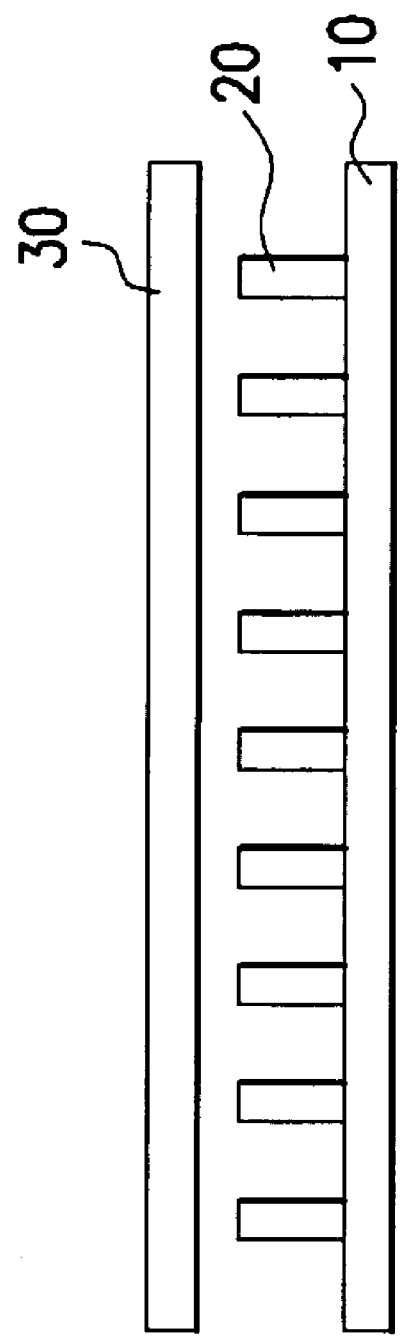
FIG. 2 is a sectional view of the transfer apparatus shown in FIG. 1 taken along the line II–II'.
Figure 3:
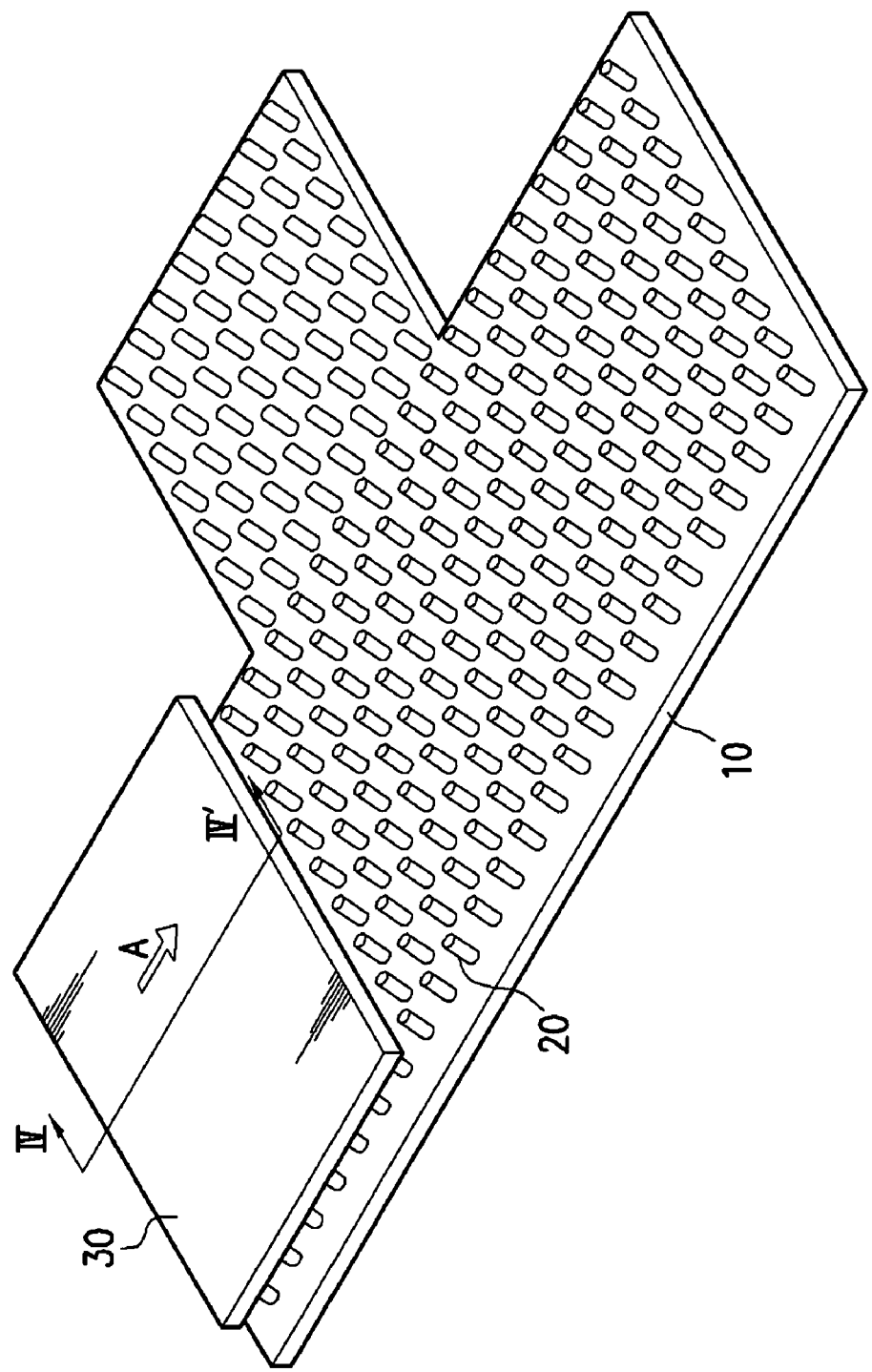
FIG. 3 is a perspective view of a transfer apparatus according to the first embodiment of the present invention showing a state in which a glass substrate is being transferred.
Figure 4:
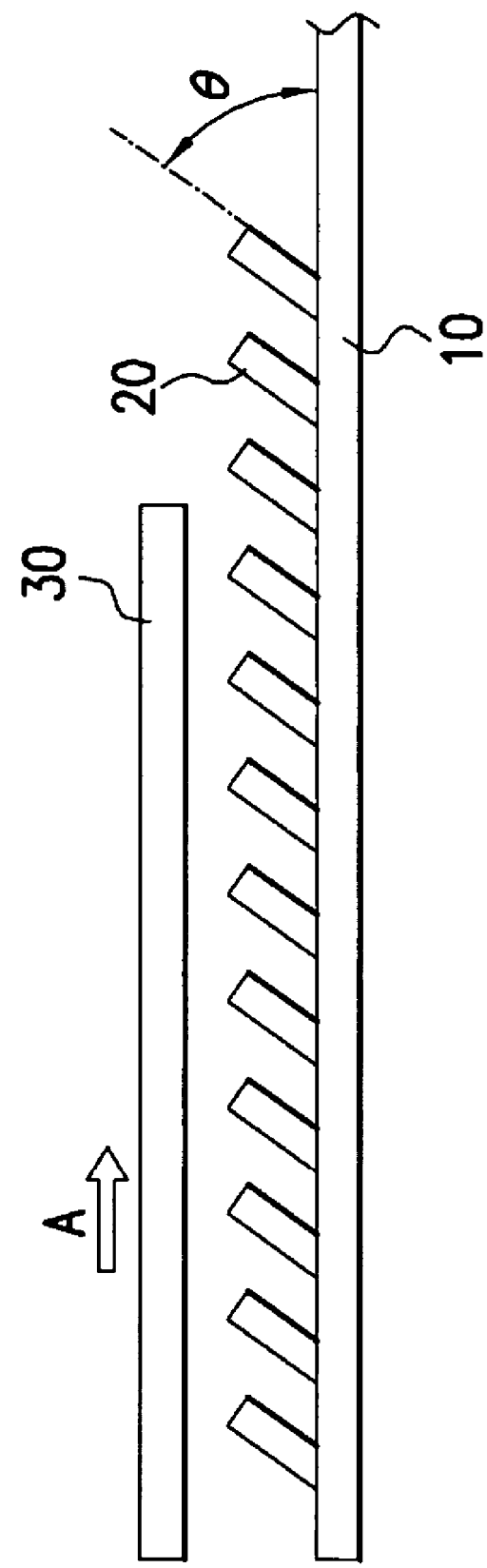
FIG. 4 is a sectional view of the transfer apparatus shown in FIG. 3 taken along the line IV–IV'.
Figure 5:
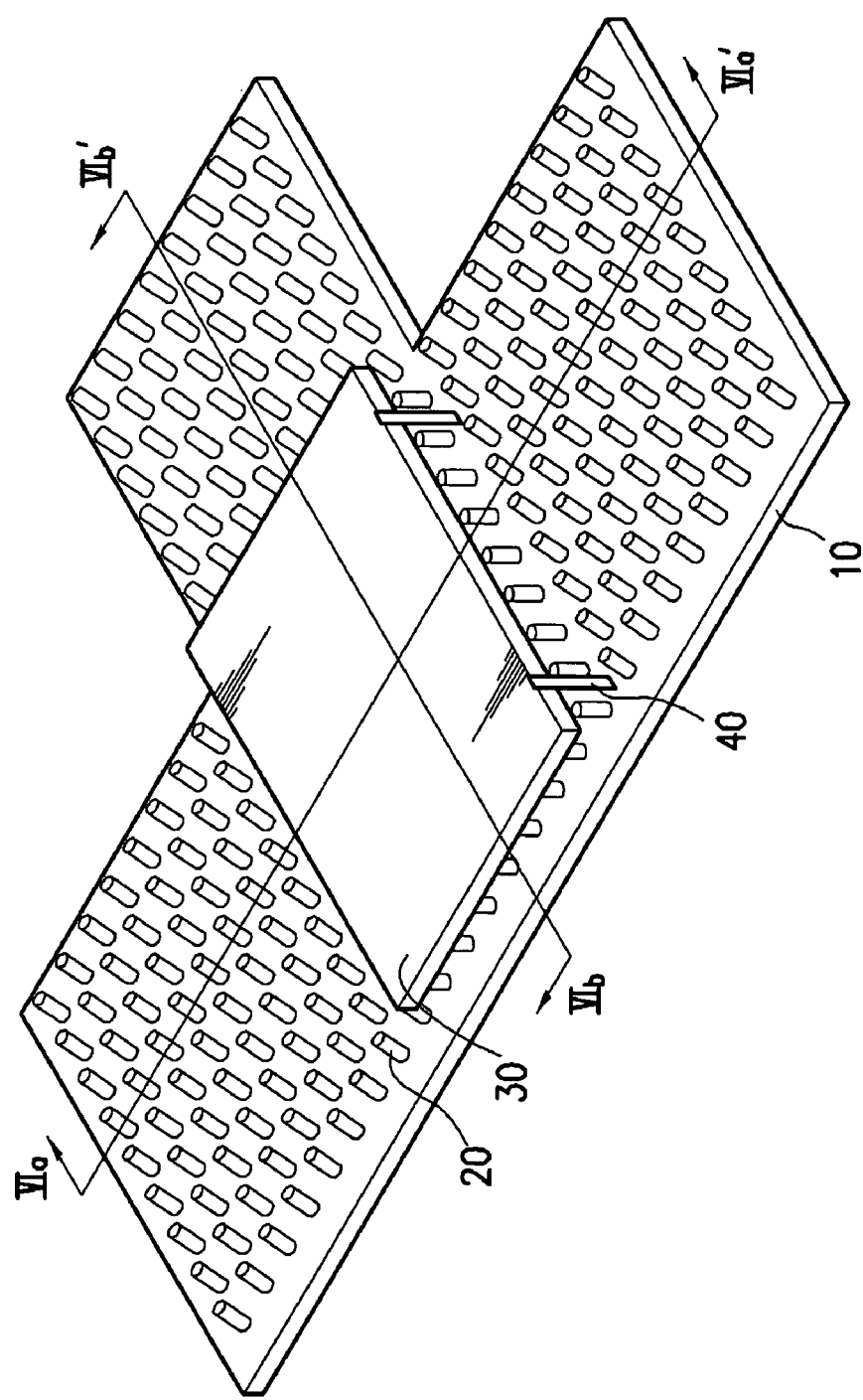
FIG. 5 is a perspective view of a transfer apparatus according to the first embodiment of the present invention showing a state in which a glass substrate is stopped at a branch point.
Figure 6A:
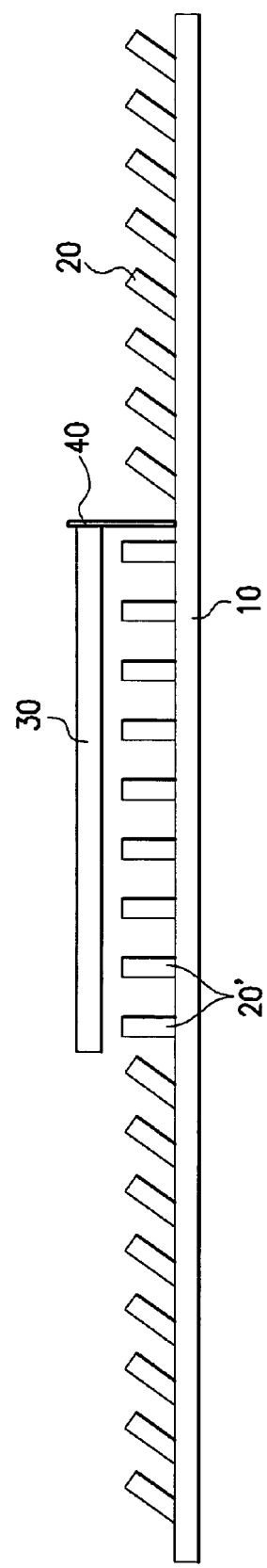
FIGS. 6A and 6B are sectional views of the transfer apparatus shown in FIG. 5 taken along the lines VIA–VIA' and VIB–VIB', respectively.
Figure 6B:
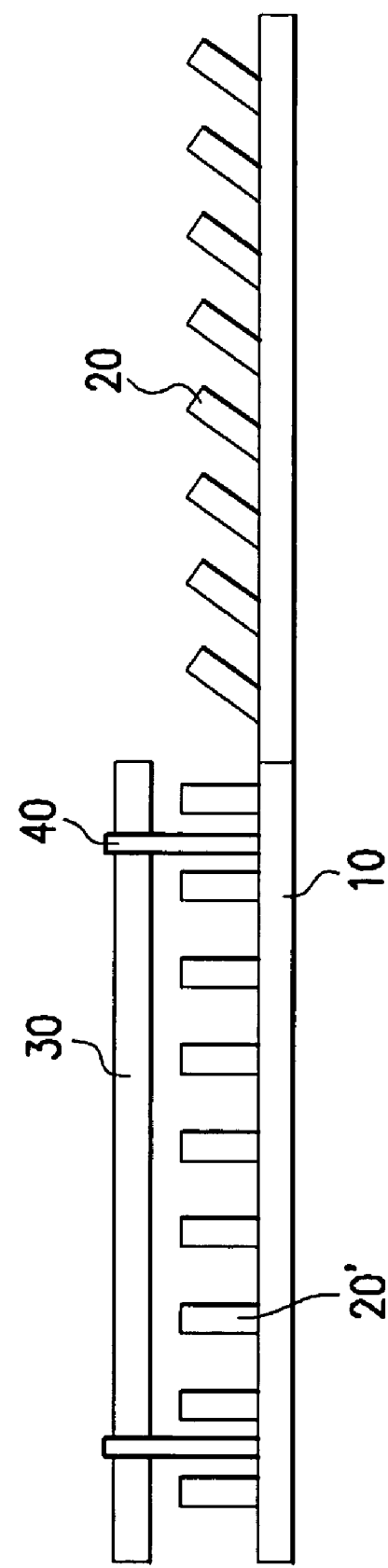
Figure 7:
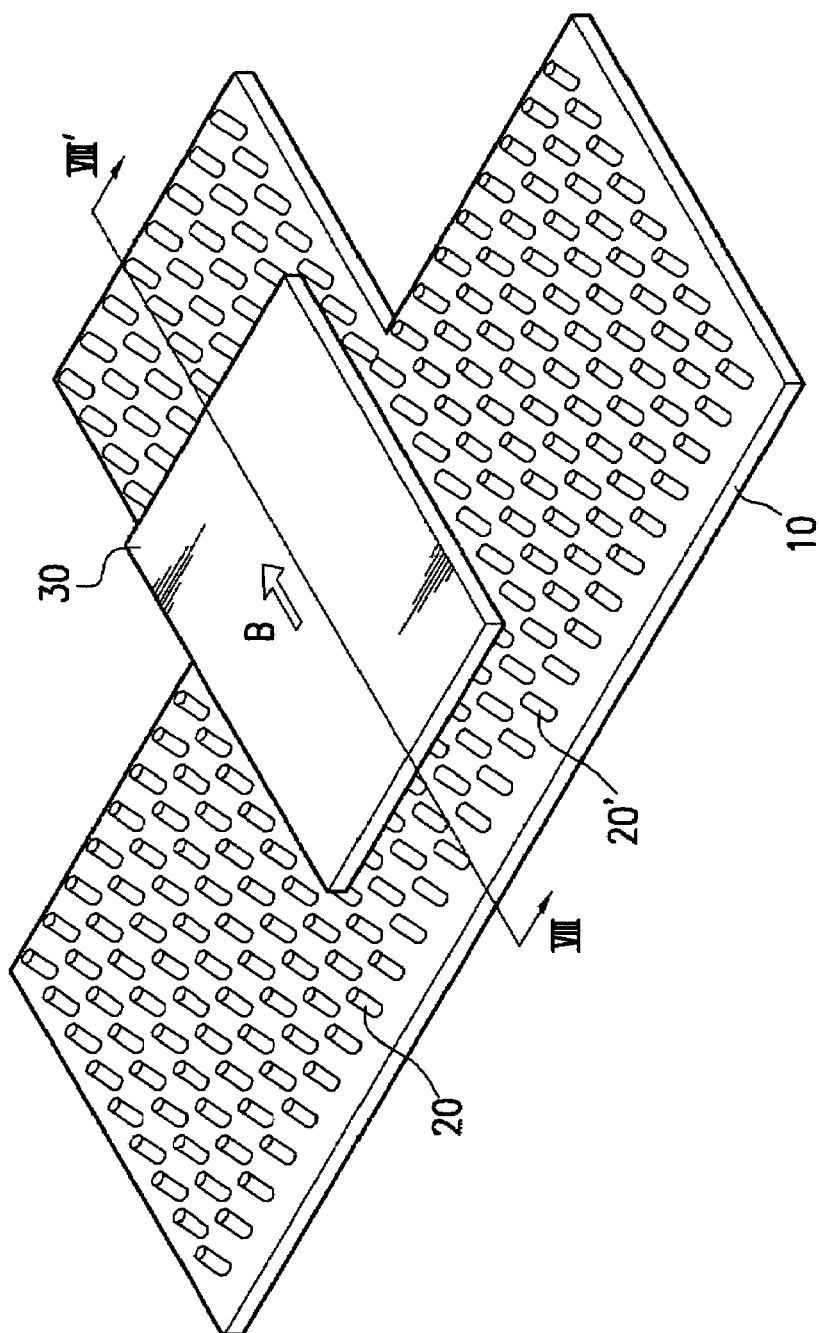
FIG. 7 is a perspective view of a transfer apparatus according to the first embodiment of the present invention showing a state in which a glass substrate is moved from a branch point to a branch direction.
Figure 8:
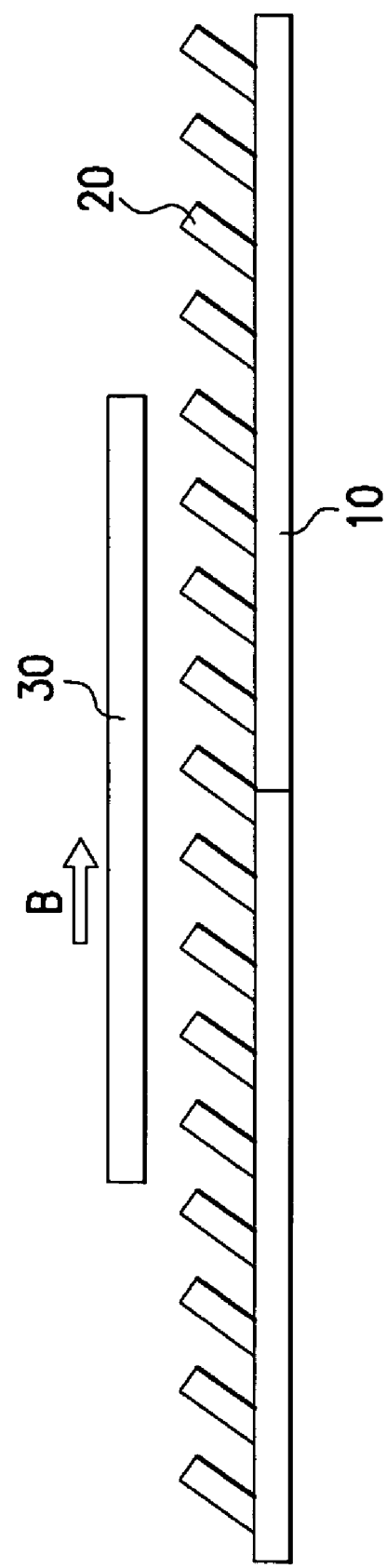
FIG. 8 is a sectional view of the transfer apparatus shown in FIG. 7 taken along the lines VIII–VIII'.
Figure 13:
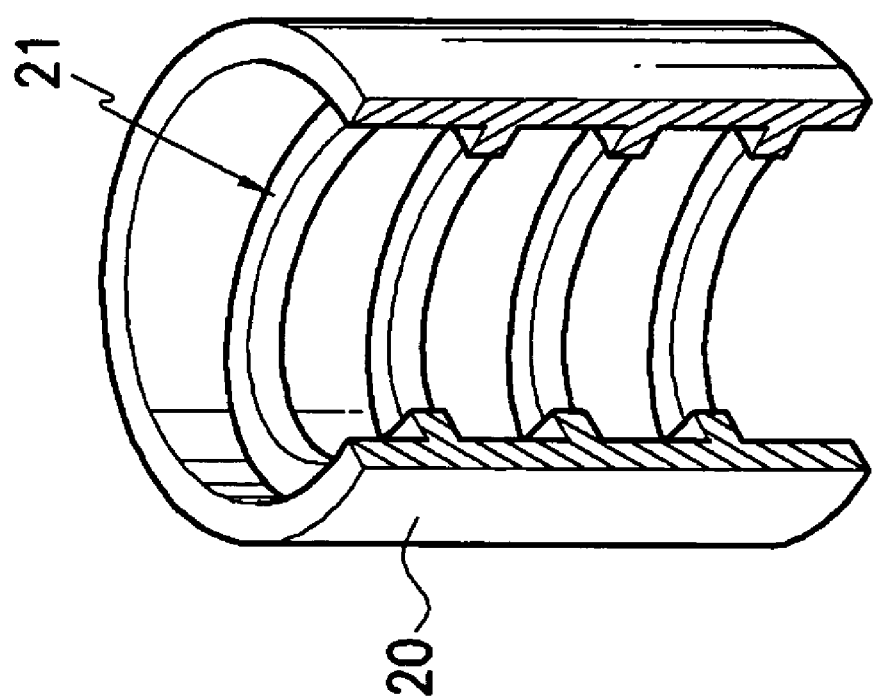
FIG. 13 is a perspective view of an embodiment of an air transfer groove formed inside an air nozzle.

FIGS. 1–8 and 13 illustrate a transfer apparatus according to a first embodiment of the present invention. FIG. 1 is a perspective view of an example of the transfer apparatus showing a state in which a glass substrate is stopped. FIG. 2 is a sectional view of the transfer apparatus shown in FIG. 1 taken along the line II–II', FIG. 3 is a perspective view of an example of the transfer apparatus showing a state in which the glass substrate is being transferred. FIG. 4 is a sectional view of the transfer apparatus shown in FIG. 3 taken along the line IV–IV'. FIG. 5 is a perspective view of an example of the transfer apparatus showing a state in which the glass substrate is stopped at a branch point. FIGS. 6A and 6B are sectional views of the transfer apparatus shown in FIG. 5 taken along the lines VIA–VIA' and VIB–VIB', respectively. FIG. 7 is a perspective view of an example of the transfer apparatus showing a state in which the glass substrate is transferred from a branch point to a branch direction. FIG. 8 is a sectional view of the transfer apparatus shown in FIG. 7 taken along the lines VIII–VIII'. FIG. 13 illustrates a perspective view of an embodiment of an air transfer groove formed inside an air nozzle.

Referring now to FIGS. 1 and 2, a transfer apparatus includes a support panel 10 and a plurality of air nozzles 20 that are formed on the support panel 10 for transferring a transfer object 30, in one example a glass substrate. FIGS. 1 and 2 illustrate transfer object 30 at a rest position.

The support panel 10 is arranged along the transfer direction of transfer object 30. In other words, support panel 10 is installed along desired transfer directions for the transfer object, for example along a transfer direction A of transfer object 30 and also along a branch direction B (FIGS. 7 and 8) in which transfer object 30 is carried after being branched off at a branch point of support panel 10. The plurality of air nozzles 20 formed on support panel 10 are arranged along direct transfer direction A and also along branch direction B. When transfer object 30 is carried, air nozzles 20 are placed under the transfer object 30.

As can be seen in FIG. 2, air nozzles 20 are in a perpendicular configuration such that air nozzles 20 inject air in a perpendicular direction relative to transfer object 30 and support panel 10. The physical structure of air nozzles 20 and transfer object 30 do not come into contact with one another. Instead, air nozzles 20 are placed to maintain a prescribed distance between transfer object 30 and each of the plurality of air nozzles 20. In order to accomplish this, the plurality of air nozzles 20 fix the position of transfer object 30 by injecting air and forming a vacuum status inside each of the plurality of air nozzles 20 to prevent transfer object 30 from straying by the injection of air. In other words, at each air nozzle, there is simultaneous air injection impinging on the surface of the transfer object and a vacuum or suction effect, similar to a whirlpool's center, and thus the air injection "sticks" to the transfer object, thereby stabilizing the position of the transfer object.

FIG. 13 is a perspective view of a section of an air transfer groove 21 formed inside an air nozzle 20 to form a vacuum status inside each of the plurality of air nozzles 20. Air transfer groove 21 can be formed to have various forms for creating simultaneous air injection and suction. In one example, air transfer groove 21 can be formed to be slanted or spiral in shape.

Referring now to FIGS. 3 and 4, an example is illustrated of transfer object 30 being moved or transferred in direction A. The plurality of air nozzles 20 are formed such that inclination of air nozzles 20 relative to the transfer direction can be controlled. FIG. 4 illustrates air nozzles 20 making a specified angle θ with reference to the transfer direction of transfer object 30, in one example direction A.

Control over the inclination of air nozzles 20 in conjunction with pressure of the air injection directs the transfer or movement of transfer object 30. If transfer direction A of transfer object 30 and the inclination of air nozzle 20 make up an angle over 0 degrees and under 90 degrees in an up and down direction, transfer object 30 would be transferred forward. If transfer direction A of transfer object 30 and the inclination of air nozzle 20 make up an angle over 90 degrees and under 180 degrees in an up and down direction, transfer object 30 would be transferred backward. Referring to FIG. 2, if transfer direction A of transfer object 30 and the inclination of air nozzle 20 make up an angle of 90 degrees, transfer object 30 would be stopped. Transfer speed of transfer object 30 can be controlled by controlling pressure and direction of the air injected via air nozzles 20.

Advantageously, since the plurality of air nozzles 20 and transfer object 30 are not in contact with one another but maintain a prescribed distance with each other, the transfer speed is enhanced, no noise is generated, and the transfer object is transferred without damage. Distance between air nozzles 20 and transfer object 30 is preferably between about 10 μm and about 30 μm.

As noted previously, the plurality of air nozzles 20 are formed to be able to make a specified angle in up and down or back and forth directions with reference to the transfer direction of transfer object 30. Referring now to FIGS. 5, 6a, and 6b, a certain set of air nozzles 20' can form a perpendicular or 90 degree angle with reference to the transfer direction of transfer object 30 when stopping and/or changing the direction of transfer object 30 at a branch point in support panel 10. Thus, some air nozzles may operate independently from one another so as to be inclined at different angles or operate with different air injection pressures in order to stop and/or change the direction of transfer object 30 during transport.

As shown in FIGS. 7 and 8, when transfer object 30 arrives at a branch point and is stopped, the plurality of air nozzles 20' switch their inclination to branch direction B to direct transfer object 30 along the branch support panel 10 in branch direction B. Transfer object 30 can be transferred to branch direction B by switching the direction of air nozzles 20' to make an angle over 0 degrees and under 90 degrees in left and right directions with reference to the transfer direction of transfer object 30.

The operation of the transfer apparatus according to an embodiment of the present invention having a structure as described above will now be described.

First, as shown in FIGS. 1 and 2, the plurality of air nozzles 20 engage transfer object 30 without contacting transfer object 30 with the physical structure of air nozzles 20 by injecting air. Since the plurality of air nozzles 20 are inclined 90 degrees, transfer object 30 is not moving or being transferred and is instead in a rest position.

Next, as shown in FIGS. 3 and 4, the plurality of air nozzles 20 are inclined to have a specified angle in up and down directions with reference to direct transfer direction A of transfer object 30. The inclination of air nozzles 20 also directs the air injection from the plurality of air nozzles 20 such that transfer object 30 slides in direct transfer direction A.

Advantageously, the present invention does not require a separate driving motor or driving roller. Since the physical structures of air nozzles 20 and transfer object 30 do not come into contact with one another but instead maintain a prescribed distance from one another, there is no power loss due to friction thereby enhancing the transfer speed and no contact noise is generated.

Subsequently, as shown in FIGS. 5, 6A, and 6B, when transfer object 30 arrives at the branch point, the plurality of air nozzles 20' stop transfer object 30 by being positioned such that air nozzles 20' make a 90 degree angle relative to the transfer direction of transfer object 30. Preferably, a separate stopping pin 40 is used as well to stop transfer object 30 at the branch point.

Succeedingly, as shown in FIGS. 7 and 8, when transfer object 30 is stopped after arriving at the branch point, the plurality of air nozzles 20' are inclined toward branch direction B. The inclination of air nozzles 20' also directs the air injection from the plurality of air nozzles 20' such that transfer object 30 slides in branch direction B. Advantageously, since transfer object 30 can be branched off by simply switching the direction of a certain set of air nozzles 20', a separate feeder for branching off is not needed, and problems with slow transfer speed at branch points can be resolved.

Figure 9:
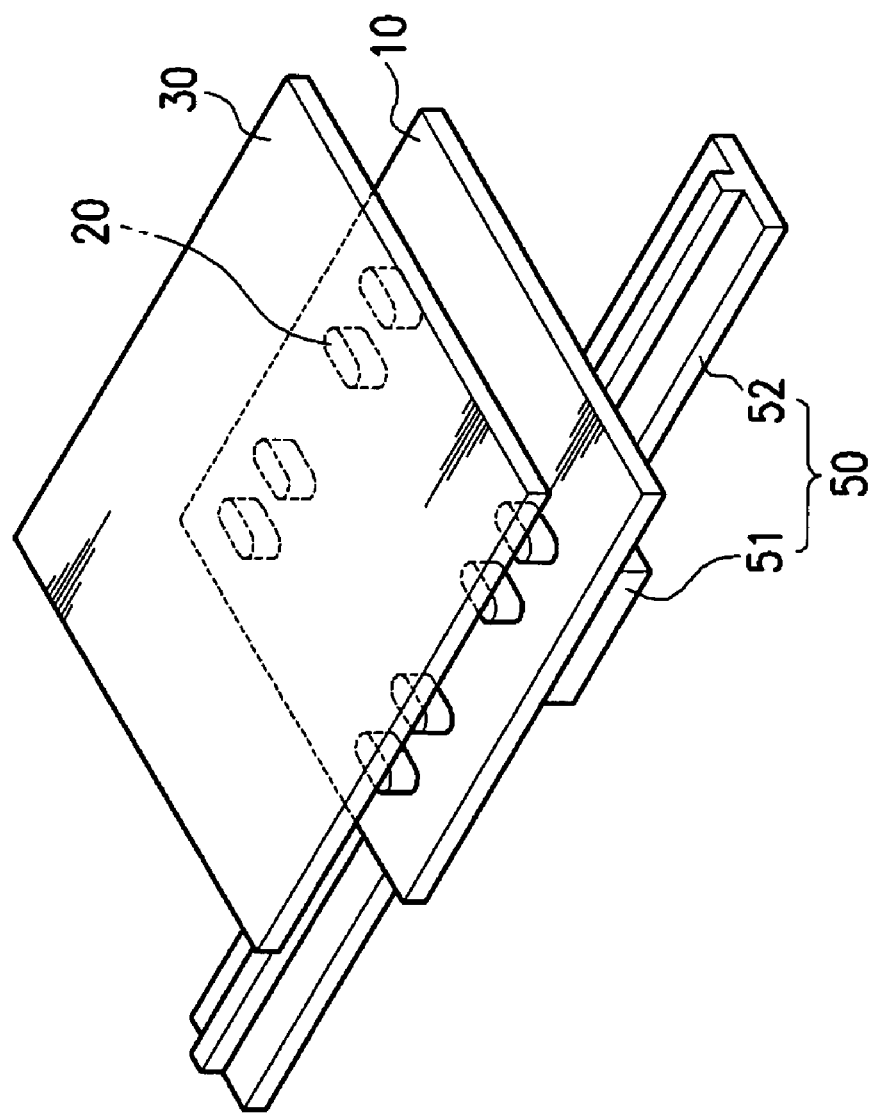
FIG. 9 is a perspective view of a transfer apparatus according to a second embodiment of the present invention.
Figure 10:
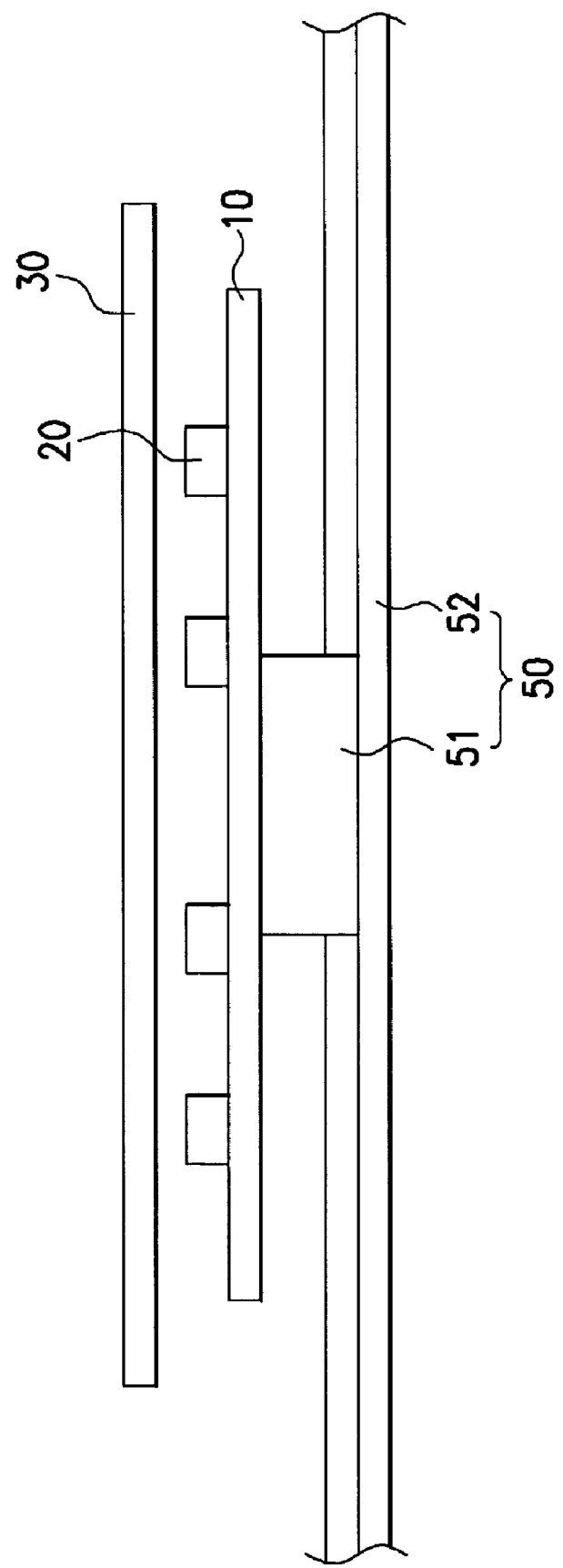
FIG. 10 is a lateral view of the transfer apparatus shown in FIG. 9.

FIG. 9 is a perspective view of a transfer apparatus according to a second embodiment of the present invention, and FIG. 10 is a lateral view of the transfer apparatus shown in FIG. 9. The same reference numerals in the drawings mentioned above indicate similar parts for performing similar functions.

As shown in FIGS. 9, 10, and 13, a transfer apparatus according to the second embodiment of the present invention includes a support panel 10 operably coupled to a transfer means 50 for transferring a transfer object 30. Transfer means 50 includes a connection body 51 and a guide line 52 on which connection body 51 is operably coupled and moved by sliding.

A plurality of air nozzles 20 are arranged on support panel 10, and in a similar manner as described above with respect to the first embodiment, the plurality of air nozzles 20 fix the position of transfer object 30 by injecting or sucking air to form a vacuum status inside each of the plurality of air nozzles 20 while maintaining a specified distance with transfer object 30. In other words, the physical structures of air nozzles 20 and transfer object 30 do not come into contact with one another and maintain a prescribed distance from one another. In order to do that, air nozzles 20 fix the position of transfer object 30 by injecting air and forming a vacuum status inside each of the plurality of air nozzles 20 to prevent transfer object 30 from straying by the injection of air.

Referring again to FIG. 13, an air transfer groove 21 is formed inside each air nozzle 20 to form a vacuum status inside air nozzle 20. Air transfer groove 21 can be formed into various forms such as slanted or spiral shapes.

Accordingly, as connection body 51 is moved along guide line 52, coupled support panel 10 also moves along guide line 52, thus moving transfer object 30 which is fixed to air nozzles 20 arranged on support panel 10.

The operation of the transfer apparatus according to the second embodiment of the present invention having a structure as described above will now be described.

First, transfer object 30 is fixed by a plurality of air nozzles 20 placed on support panel 10 to have a specified distance between the air nozzles and the transfer object.

Next, transfer object 30 is transferred by transfer means 50 connected to the support panel 10.

Advantageously, it is possible to transfer transfer object 30 without contacting a pattern portion of an LCD formed on transfer object 30. Furthermore, when the transfer object has to be moved along a different direction, the transfer object may be simply transferred to the other direction by rotating transfer means 50.

It is also possible to pick up and transfer the transfer object 30 from above as is described in a third embodiment below.

Figure 11:
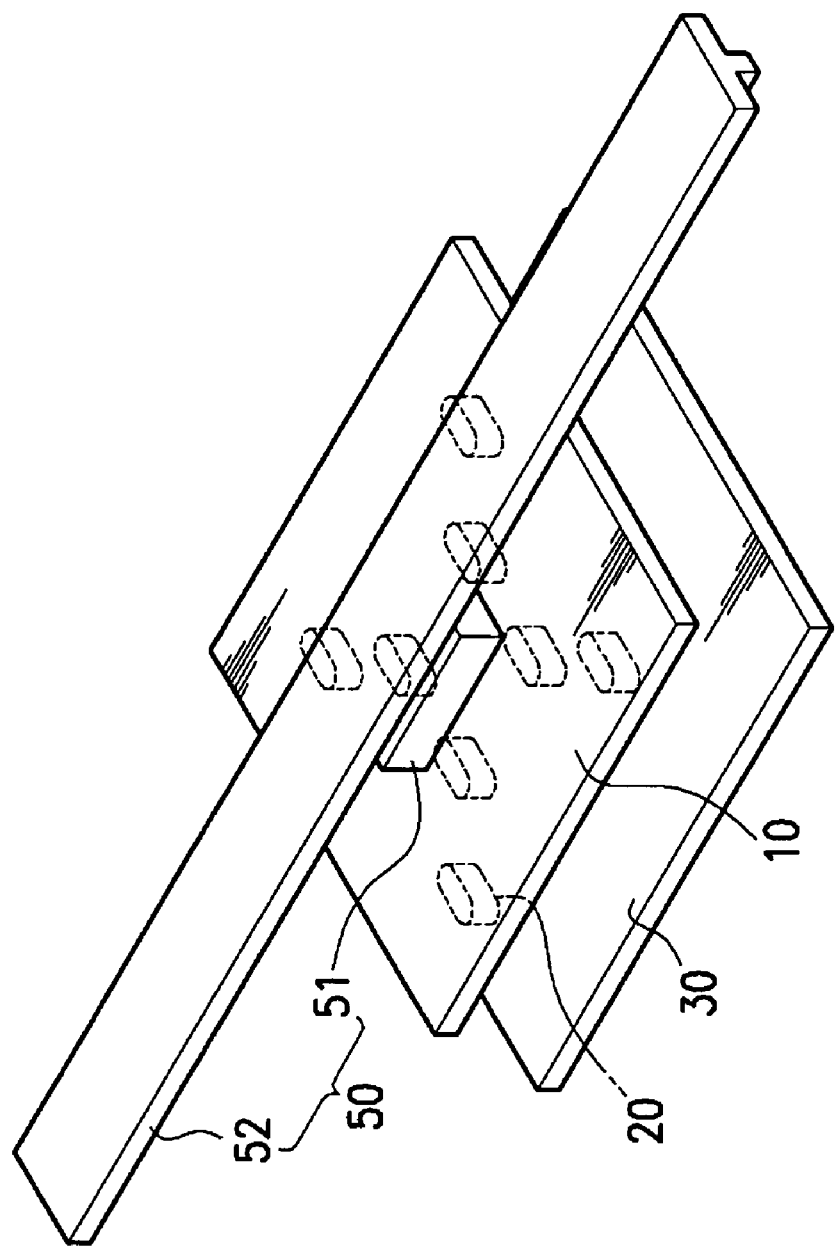
FIG. 11 is a perspective view of a transfer apparatus according to a third embodiment of the present invention.
Figure 12:
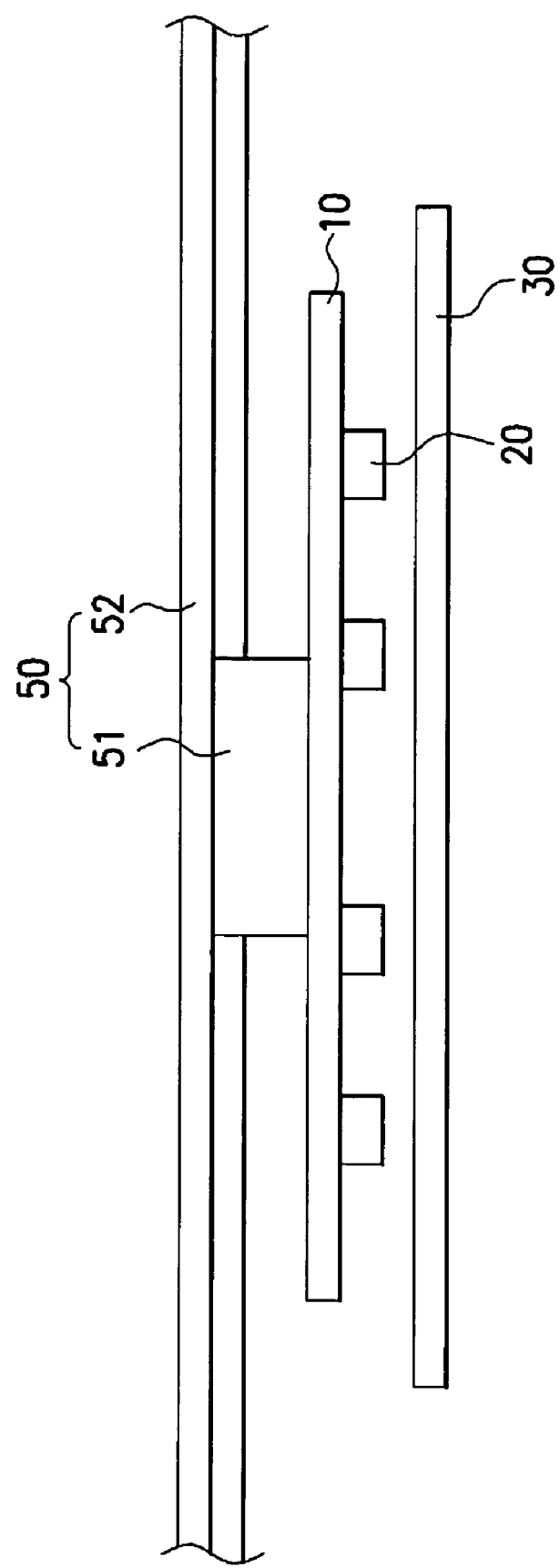
FIG. 12 is a lateral view of the transfer apparatus shown in FIG. 11.

FIG. 11 is a perspective view of a transfer apparatus according to the third embodiment of the present invention, and FIG. 12 is a lateral view of the transfer apparatus shown in FIG. 11. The same reference numerals as in drawings mentioned above indicate similar parts for performing similar functions.

As shown in FIGS. 11, 12, and 13, a transfer apparatus according to the third embodiment of the present invention includes a support panel 10 and a transfer means 50 for transferring the support panel 10. Transfer means 50 includes a connection body 51 connected to a top portion of support panel 10 and a guide line 52 on which connection body 51 is operably coupled and moved by sliding.

A plurality of air nozzles 20 are arranged under support panel 10, and the plurality of air nozzles 20 fix the position of transfer object 30 by injecting or sucking air while maintaining a specified distance with transfer object 30. In other words, the plurality of air nozzles 20 and transfer object 30 are not contacted but placed to maintain a prescribed distance with each other. In order to do that, air nozzles 20 fix the position of transfer object 30 by injecting air and forming a vacuum status inside each of the plurality of air nozzles 20 to prevent transfer object 30 from straying by the injection of air.

Referring again to FIG. 13, an air transfer groove 21 is formed inside each air nozzle 20 to form a vacuum status inside air nozzle 20. Air transfer groove 21 can be formed to have various forms, such as slanted or spiral shapes.

Accordingly, as connection body 51 moves along guide line 52, coupled support panel 10 also moves along guide line 52, thus moving transfer object 30 which is fixed to air nozzles 20 arranged on support panel 10.

The operation of the transfer apparatus according to the third embodiment of the present invention having a structure as described above will now be described.

First, transfer object 30 is fixed by the plurality of air nozzles 20 placed under support panel 10 to have a specified distance between air nozzles 20 and transfer object 30.

Next, the transfer object 30 is transferred by transfer means 50 connected to the support panel 10.

Advantageously, it is possible to transfer transfer object 30 without contacting a pattern portion of an LCD formed on transfer object 30. Furthermore, when the transfer object has to be rotated to be transferred to another direction, the transfer object can be simply transferred to the other direction by rotating transfer means 50.

Since the present invention transfers the transfer object, in one example a glass substrate, by only using air, the structure of the apparatus becomes simple and investment cost for the initial manufacturing processing device is reduced because a stocker, a cassette, and/or an indexer are not used.

Moreover, yield is enhanced by preventing breaking or cracks due to contact and by preventing chemical or particle contamination by providing transfer of the glass substrate without contacting the glass substrate with the air nozzles.

In addition, since the glass substrate is transferred without friction, the transfer speed is enhanced and the time required for transfer is shortened.

Furthermore, because the glass substrate is transferred only using air, the problem of transfer delay upon changing the transfer direction, for example when the glass substrate is rotated, branched off, joined together, or buffered, is resolved.

Since a gear for connection between power axes, or a chain or a belt which is a medium of power transfer is not needed, noise due to the revolution of the motor and that due to tooth-setting of the gears for connection between power axes are reduced.

It will be apparent that the present invention may be used in conjunction with various processing apparatus in various manufacturing systems such as those described in co-pending U.S. patent application Ser. No. 10/863,064 with the same filing date which is incorporated by reference herein for all purposes.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

We claim:

1. A transfer apparatus, comprising:
a panel; and,
a plurality of air nozzles operably coupled to the panel, wherein the plurality of air nozzles inject air to hold a transfer object in place above the plurality of air nozzles without the plurality of air nozzles making contact with the transfer object, and
wherein an angle of each of the air nozzles relative to the panel can be controlled.

2. The apparatus of claim 1, wherein the panel includes at least one branch point and a corresponding branch panel.

3. The apparatus of claim 1, wherein the panel includes a T-section.

4. The apparatus of claim 1, wherein each of the plurality of air nozzles provide a suction simultaneously with the injected air.

5. The apparatus of claim 1, wherein each of the plurality of air nozzles includes a groove in the interior surface of the air nozzle.

6. The apparatus of claim 5, wherein the groove is spiral in shape.

7. The apparatus of claim 1, wherein at least one of the plurality of air nozzles can operate independently from the remaining plurality of air nozzles.

8. The apparatus of claim 1, wherein the transfer object is held above a tip of the air nozzle a distance between about 10 µm and about 30 µm.

9. The apparatus of claim 1, further comprising a stopping pin operably coupled to the panel.

10. A transfer apparatus, comprising:
a connection body slidably coupled to a guide line;
a panel section operably coupled to the connection body; and,
a plurality of air nozzles operably coupled to the panel section,
wherein the plurality of air nozzles inject air to hold a transfer object in place without the plurality of air nozzles making contact with the transfer object.

11. The apparatus of claim 10, wherein the transfer object is held in place above the plurality of air nozzles.

12. The apparatus of claim 11, wherein a bottom portion of the panel section is connected to the connection body.

13. The apparatus of claim 10, wherein the transfer object is held in place below the plurality of air nozzles.

14. The apparatus of claim 13, wherein a top portion of the panel section is connected to the connection body.

15. The apparatus of claim 10, wherein the connection body is slidably coupled to the guide line.

16. The apparatus of claim 10, wherein each of the plurality of air nozzles includes a groove in the interior surface of the air nozzle.

17. The apparatus of claim 16, wherein the groove is spiral in shape.

18. The apparatus of claim 10, wherein each of the plurality of air nozzles provide a suction simultaneously with the injected air.

19. The apparatus of claim 10, wherein the transfer object is held above a tip of the air nozzle a distance between about 10 µm and about 30 µm.

20. A transfer apparatus, comprising:
a panel; and,
a plurality of air nozzles operably coupled to the panel, wherein the plurality of air nozzles inject air while simultaneously providing suction to hold a transfer object in place without the plurality of air nozzles making contact with the transfer object, and
wherein an angle of each of the air nozzles relative to the panel can be controlled.

21. The apparatus of claim 20, wherein the panel includes at least one branch point and a corresponding branch panel.

22. The apparatus of claim 20, wherein the panel includes a T-section.

23. The apparatus of claim 20, wherein each of the plurality of air nozzles includes a groove in the interior surface of the air nozzle.

24. The apparatus of claim 23, wherein the groove is spiral in shape.

25. The apparatus of claim 20, wherein at least one of the plurality of air nozzles can operate independently from the remaining plurality of air nozzles.

26. The apparatus of claim 20, wherein the transfer object is held above a tip of the air nozzle a distance between about 10 µm and about 30 µm.

27. The apparatus of claim 20, further comprising a stopping pin operably coupled to the panel.

* * * * *